United States Patent [19]

Jewell et al.

[11] Patent Number: 5,446,754
[45] Date of Patent: Aug. 29, 1995

[54] PHASED ARRAY SEMICONDUCTOR LASER

[75] Inventors: Jack L. Jewell; Greg R. Olbright, both of Boulder, Colo.

[73] Assignee: Photonics Research Incorporated, Longmont, Colo.

[21] Appl. No.: 147,564

[22] Filed: Nov. 5, 1993

[51] Int. Cl.[6] .......................... H01S 3/05; H01S 3/10; H01S 3/18
[52] U.S. Cl. ........................ 372/50; 372/97; 372/18
[58] Field of Search .............. 372/98, 18, 50, 103, 372/97, 96

[56] References Cited

U.S. PATENT DOCUMENTS

| | | | |
|---|---|---|---|
| 4,677,629 | 6/1987 | Lesh | 372/18 |
| 4,764,929 | 8/1988 | Thaniyavarn | 372/18 |
| 4,813,762 | 3/1989 | Leger et al. | 372/18 |
| 5,027,359 | 6/1991 | Leger et al. | 372/18 |
| 5,295,147 | 3/1994 | Jewell et al. | 372/98 |

OTHER PUBLICATIONS

Vakhshoori, D., Hong, M., Asom, M., Leibenguth, R. E., Mannaerts, J. P., and Wynn, J. D., "Zone Lasers," *Appl, Phys. Lett.,* vol. 65, No. 2 (Jul. 11, 1994).

M. E. Warren et al., "On-axis for field emission from . . . " Appl. Phys. letter 61 (13) 28 Sep. 1992 pp. 1484–1486.

M. Orenstein et al., "Large two-dimensional arrays of . . . " Appl. Phys. Letter 60 (13), 30 Mar. 1992 pp. 1535–1537.

G. R. Hadley, "Modes of a two-dimensional phase--locked . . . " Optics Letters 15 (21), 1 Nov. 1990, pp. 1215–1217.

D. Botez et al. "Watt-range, coherent, uniphase powers from . . . " Appl. Phys. Lett. 58 (19). 13 May 1991 pp. 2070–2072.

*Primary Examiner*—Rodney B. Bovernick
*Assistant Examiner*—Robert McNutt
*Attorney, Agent, or Firm*—Fisher & Associates

[57] ABSTRACT

A phased array of semiconductor laser elements is provided in which the percentage of light which propagates into different diffractive orders is modified by an optical element. The diode laser includes a body of a semiconductor material having an active region therein which is adapted to generate radiation and emit the radiation form a surface of the body, and separate reflecting mirrors at opposite sides of the active region with at least one of the mirrors being partially transparent to the generated light to allow the light generated in the active region to be emitted therethrough. The optical element may take the form of a modification in the arrangement of the semiconductor laser elements, or an array of microprisms, or an external mirror to modify the percentage of light which propagates into different diffractive orders.

46 Claims, 6 Drawing Sheets

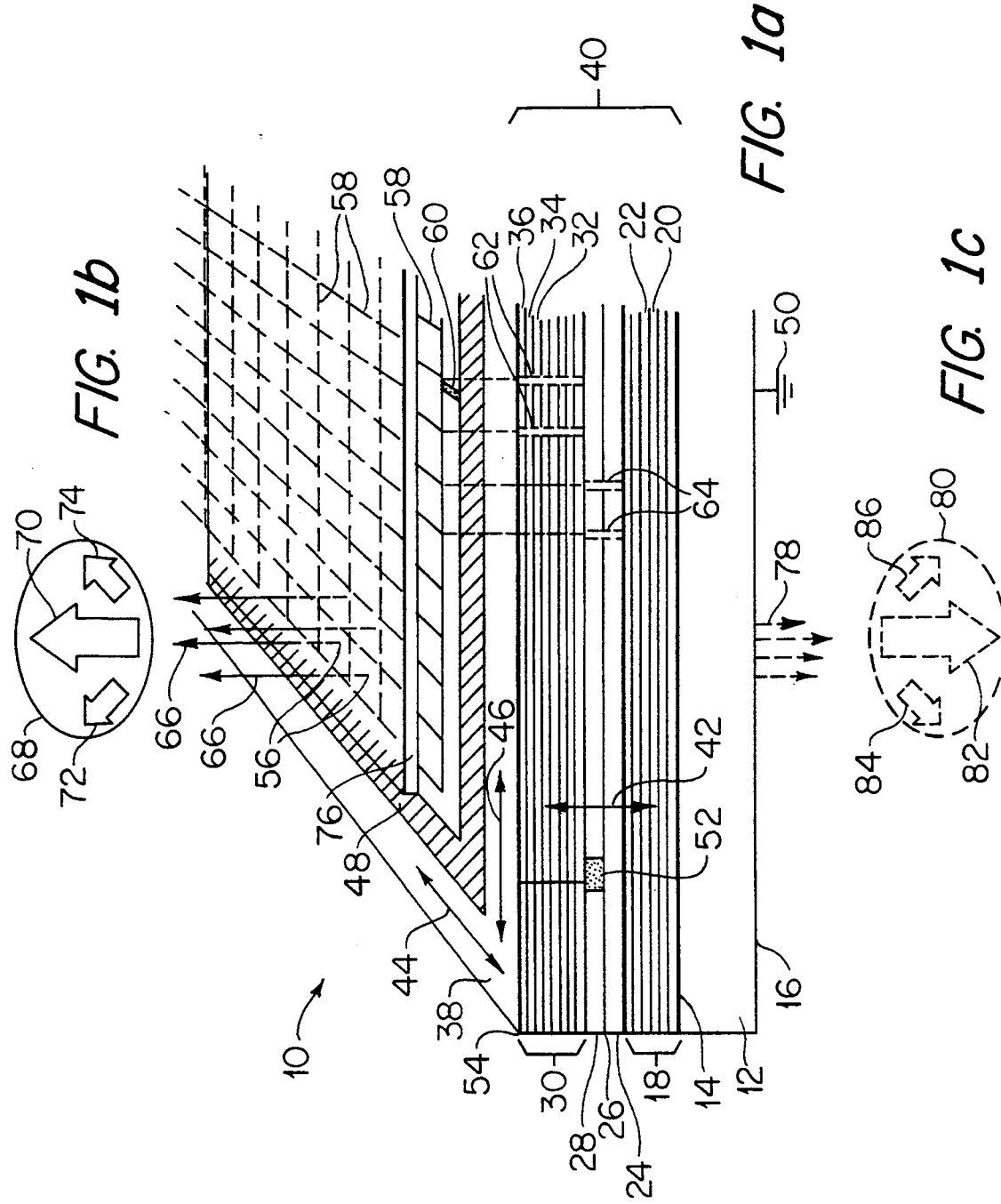

PHASED ARRAY SEMICONDUCTOR LASER

BACKGROUND OF THE INVENTION

1. Field of the Invention

The present invention relates to a semiconductor laser, segmented into lasing elements, whose emitted beam elements may be combined into a single beam of light and, more particularly, to an array of semiconductor lasers containing an additional optical element which modifies the percentage of light which propagates into a diffractive order. Emphasis is placed on vertical-cavity surface-emitting lasers.

2. Description of the Prior Art

Semiconductor laser diodes, in general, comprise a body of a semiconductor material having adjacent regions of opposite conductivity type forming a p-n junction therebetween. The body is adapted to generate and emit radiation when an appropriate potential is applied across the p-n junction. Vertical-cavity, surface-emitting lasers (VCSELs) emit radiation in a direction perpendicular to the plane of the p-n junction or substrate rather than parallel to the plane of the p-n junction as in the case of conventional edge-emitting diode lasers. In contrast to the elliptical and astigmatic beam quality of conventional edge emitting lasers, VCSELs advantageously emit a circularly symmetric Gaussian beam and thus do not require anamorphic correction. VCSELs moreover, may be readily made into two-dimensional laser arrays as well as may be fabricated in extremely small sizes. Accordingly, two-dimensional VCSEL arrays have various applications in the fields of optical memory, laser printing and scanning, optical communications, optoelectronic integrated circuits, optical computing, optical interconnection, etc. Some applications require high power beams to be focused into a single spot. The power required is much larger than the power readily obtainable from a single-transverse-mode VCSEL. Thus, attempts have been made to operate a large array of VCSELs, each emitting a beam element, and combine the beam elements into a single beam of light which may be focused into a single spot.

There are three basic requirements for combining an array of beam elements of light from an array of lasers into a single beam of light which may be focused into a single spot. The first requirement is that the phases of the light waves from each beam element must be strongly phase coupled. The second requirement is that the phase difference between the light waves from beam elements must be close to zero. The third requirement is that the diffraction, caused by the structure of the array of lasers, must be controlled. While the prior art describes attempts to accomplish the first two stated requirements, it is absent of techniques to accomplish the third. Because phase coupling between laser elements is stronger in two-dimensional array configurations than it is for one-dimensional arrays, the discussion will concentrate on two-dimensional arrays. It should be appreciated that this discussion is also generally applicable to one-dimensional as well as multi-dimensional arrays. Since VCSEL technology represents the most practical means for fabricating two-dimensional arrays, the discussion furthermore concentrates on VCSELs. However the results are also valid for any type of semiconductor laser.

An effective technique for fabricating a phase-coupled array of VCSELs is described in an article by M. Orenstein et al., entitled "Large two-dimensional arrays of phase-locked vertical cavity surface emitting lasers," published in *Applied Physics Letters*, Vol. 60 (13) (Mar. 30, 1992), pgs. 1535–1537. In this technique, VCSEL elements are separated by a square grid of patterned metal over a wide aperture, with each VCSEL element on the order of 10 micrometers across. Although the laser elements are phase coupled, adjacent laser elements have a 180 degree phase difference between them. This "out-of-phase coupling" results in the propagation of four beams of equal intensity, rather than the desired single beam. The technique thus satisfies only the first of the above-stated requirements. It is well known that most phase-coupling techniques, such as this, result in out-of-phase coupling and thus produce four-beam propagation for two-dimensional arrays, and two-beam propagation for one-dimensional arrays. An improvement upon this technique is described in an article by M. E. Warren et al., entitled "On-axis far-field emission from two-dimensional phase-locked vertical cavity surface-emitting laser arrays with an integrated phase corrector," published in *Applied Physics Letters*, Vol. 61 (Sep. 28, 1992), pgs. 1484–1486. In this technique the laser elements are allowed to couple out of phase. A phase plate on top of the laser array then produces a 180 degree phase shift of half of the elements, bringing all laser elements in phase with one another. This technique, therefore, additionally satisfies the second requirement for combining beam elements into a single beam. The experimental demonstration by Warren et al. was idealized somewhat in that the laser was optically pumped, rather than electrically pumped as is preferred. Despite the idealized configuration, only about 50% of the light propagated into a single diffractive order. The remainder of the light propagated into other diffractive orders. The diffraction of a significant amount of the light into multiple diffractive orders will render the laser array either inefficient or impractical for nearly all desired applications.

The diffraction pattern published by Warren et al. strongly resembles the pattern which would be expected if one illuminated a square-pattern diffraction grating with a coherent beam of light. When the amplitude of the light in a phase-coupled array is considered as well as the phase, diffraction of the phase-coupled light into higher diffractive orders is expected. The light amplitude must be zero at the grid lines which separate the light elements, thus an effective amplitude grating is formed by the characteristics of the array of lasers.

There are additional prior art methods for combining beam elements into a single beam. One such technique utilizes a Talbot cavity in which the laser cavity is extended in order to phase couple the lasing elements as applied to VCSELs and described in an article by Ho et al., "Effective reflectivity from self-imaging in a Talbot cavity and its effect on the threshold of a finite 2-D surface emitting laser array," published in *Applied Optics*, Vol. 29 (34) (Dec. 1, 1990), pgs. 5080–5085. Another method for phase coupling lasing elements is to use "antiguides," alternatively termed "leaky mode coupling." Antiguiding is discussed for VCSELs in an article by Hadley, "Modes of a two dimensional phase-locked array of vertical-cavity surface-emitting lasers," published in *Optics Letters*, Vol. 15 (21) (Nov. 1, 1990), pgs. 1215–1217. The simultaneous use of antiguides with a Talbot cavity for edge-emitting semiconductor lasers is described in an article by Botez et al., "Watt-range, coherent, uniphase powers from phase-locked arrays of antiguided diode lasers," published in *Applied Physics Letters,* Vol. 58 (19) (May 13, 1991), pgs. 2070-2072.

The prior art experiments and simulations show light diffracted into multiple diffractive orders. The prior art does not address the problem of diffraction of light into multiple orders however, nor do they suggest a method or apparatus for correcting this diffraction problem.

SUMMARY OF THE INVENTION

The present invention relates to a semiconductor laser, and more particularly, to a semiconductor laser segmented into elements, which comprises a body of a semiconductor material having the laser structure, means for separating the lasing elements, and additional optical means for controlling the diffraction of the light beam elements which are emitted from the lasing regions. The term "additional optical means" excludes the binary phase plate described by Warren et al. and external Talbot cavities, but is meant to include any other optical means not disclosed in the prior art. One form of the invention utilizes favorable arrangements of the lasing elements to enhance the diffraction efficiency into a single diffractive order. Another form of the invention utilizes identical angled refractive microprism elements to enhance the diffraction efficiency into a single diffractive order. Still another form of the invention utilizes concentric angled refractive elements to enhance the diffraction efficiency into a single diffractive order.

The invention will now be described in connection with the accompanying drawings wherein like reference numerals have been used to designate like parts.

BRIEF DESCRIPTION OF THE DRAWINGS

FIG. 1 is an isometric sectional view of a vertical-cavity surface-emitting laser with lasing elements arranged in a rectangular array in accordance with a preferred embodiment of the present invention;

FIGS. 8a and 8b are side views of embodiments to facilitate the fabrication of the microprisms shown in FIGS. 6a and 7a.

DETAILED DESCRIPTION OF PREFERRED EMBODIMENTS

Figure 2A:
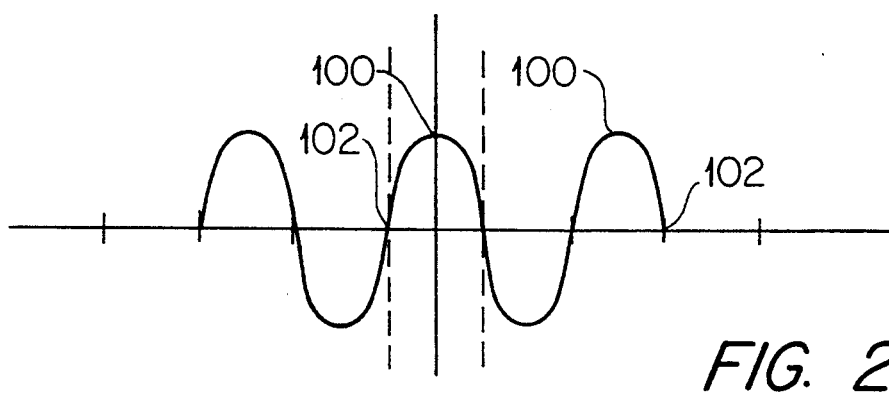
FIG. 2a is a sectional plot of light amplitude versus position of a phased array in which the relative phase difference between adjacent elements is 180 degrees.

Referring initially to FIG. 1, there is shown a sectional view of a vertical-cavity, surface-emitting laser 10, generally denoted 10. Laser 10 comprises a substrate 12 of a semiconductor material, such as GaAs or any other material known in the semiconductor art, having opposed major surfaces 14 and 16. On surface 14, the Vertical Surface Emitting Laser (VCSEL) structure is placed, starting with a first mirror 18. Mirror 18 is formed of alternating layers 20 and 22 of materials having different indices of refraction. In a preferred embodiment, mirror 18 is a distributed Bragg reflector formed of alternating layers 20 and 22. In this preferred embodiment, layers 20 and 22 are formed from semiconductor materials having high and low indexes of refraction and are also electrically conductive. Although mirror 18 is designed to be reflective, it should also be appreciated that mirror 18 may be designed to be partially transparent to light.

Disposed over mirror 18 is a first clad layer 24. Layer 24 is a semiconductor material of the same conductivity type as substrate 12. On clad layer 24 is a thin active layer 26 containing active material, such as GaAs. Disposed over active layer 26 is a second clad layer 28. Clad layer 28 is of similar material as clad layer 24 but having an opposite conductivity type. Active layer 26 may be made of a single semiconductor material, a nonconductive material or of a material having a conductivity of either type; or layer 26 may be made from a material having a single or multiple quantum well structure or a material having a superlattice structure. It should be appreciated that the above material structures are exemplary and that other material structures are within the scope of the contemplated invention. First and second clad layers 24 and 28 are formed from materials having bandgaps different from that of active layer 26. Electrons and holes to be confined to active layer 26.

On second clad layer 28 is a second mirror 30. Mirror 30 is also formed of alternating layers 32 and 34. Layers 32 and 34 are constructed from materials having different indices of refraction. A contact layer 36 having a top surface 38 is disposed over second mirror 30. Although second mirror 30, like first mirror 18 may be formed of semiconductor materials, it also may be made of dielectric materials. Regardless of what material is used for mirror 30, layers 32 and 34 will have high and low indices of refraction, respectively. Mirror 30 may also be at least partially metallic. Although second mirror 30 is designed to be reflective, it may be designed to be partially transparent to light. Together, first and second mirrors 18 and 30, first and second clad layers 24 and 28, and active layer 26 form an optical cavity 40, having a cavity axis 42, and having first and second dimensions 44 and 46, both perpendicular to cavity axis 42. On contact layer 36 at each side of, or around, or on top of second mirror 30, is a contact 48. Disposed on the surface 16 of substrate 12 is a contact 50.

In the operation of laser 10, a current is passed through active layer 26 between contacts 48. Current is confined substantially to flow within the area approximately defined by contact 48 and nonconductive region 52. Region 52 is preferably formed by a deep ion implantation. From contact 48 current is prevented from flowing away from active layer 26 by a nonconductive region 54. Nonconductive region 54 is preferably formed by a shallow ion implantation; alternatively region 54 may be formed by etching or by diffusion of other materials. The injected current generates light in active layer 26. The light is reflected back and forth between the first and second mirrors 18 and 30 along cavity axis 42 to achieve lasing of the light. Since at least one of the mirrors (e.g., second mirror 30) is partially transparent, some of the lasing light will pass out of laser 10 through the mirror which is partially transparent.

First and second dimensions 44 and 46 of laser 10, defined approximately by contact 48, are sufficiently large that laser 10 would operate in multiple transverse modes if there were no other means for controlling the transverse mode behavior. Accordingly, laser 10 has separate lasing elements 56, separated by separation means 58. Separation means 58 may comprise patterned metal, for example, a gold grid pattern whose elements have transverse dimensions about 10 micrometers, and whose lines are 2 micrometers wide. In this case it is furthermore advantageous for separation means 58 to conduct electrical current and to be connected to electrode 48 by an electrical conductor 60. Alternatively, separation means 58 may comprise an absence of reflectivity in second mirror 30, formed, for example, by partial or total etching of troughs, 62, in second mirror 30. Troughs 62 may be formed by diffusion of an appropriate material, for example zinc, through second mirror 30 in a patterned formation. In some cases, the reflectivity of top mirror 30 is modified by an optional metallic layer (not illustrated). Still another way to achieve separation means 58 is by partial or total absence of the metallic layer from top mirror 30, which may be accomplished, for example, by etching or by patterned deposition. Yet another way to construct separation means 58 is by partial or total absence of gain in active layer 26 in regions 64, which may be accomplished, for example, by deep ion implantation.

The lasing elements 56 emit light beam elements 66, whose phases are coupled, and which together form a light beam 68. Light beam 68 comprises multiple diffractive orders, including the zeroth diffractive order 70, which nominally propagates along cavity axis 42, and higher diffractive orders 72 and 74, whose propagation directions generally have components along first and/or second dimensions 44 and 46. It should be appreciated that the number of higher diffractive orders can be much larger than two. The relative proportions of diffractive orders 70, 72, and 74 are dependent upon the specific configuration of lasing elements 56. These relative proportions may be favorably modified by additional optical means 76, for example to make the fraction of light propagating into one diffractive order approach unity. The light beam elements 66 and light beam 68 are shown in FIG. 1 to propagate through top surface 38 due to partial transparency in second mirror 30. Alternatively, first mirror 18 could be partially transparent. In this case, light beam elements 78 and light beam 80 would propagate through the substrate 12 and outward through surface 16, with diffractive orders 82, 84, and 86. All techniques described for modifying light beam 68 are equally valid for the modification of light beam 80.

For efficient beam combination, it is necessary that the lasing elements 56 emit beam elements 66 which are individually in a single transverse mode. For VCSELs, this implies that the apertures of the lasing elements must be about 10 times larger than the vacuum wavelength of the light emitted into beam elements 66. It is possible however, to expand the cavity of a VCSEL in a variety of ways, for example, as described by Jewell and Olbright in their copending U.S. patent application entitled "Vertical cavity surface-emitting laser with expanded cavity," Ser. No. 07/994,976. In this way it is possible for the aperture of an individual lasing element 56 to be larger than 10 times the vacuum wavelength of the laser emission and still maintain single transverse mode emission for the lasing element 56.

At high operating powers, thermal effects may cause different lasing elements 56 to have different effective lengths of their optical cavities 40. A substantial difference in effective cavity lengths will cause the lasing elements 56 not to phase lock. It is possible to fabricate an array of VCSELs in which for the condition of negligible thermal loading, the different lasing elements 56 have different effective lengths of their optical cavities 40. It is therefore possible to fabricate a laser 10, using VCSEL technology, in which lasing elements 56 have the same effective cavity lengths under high thermal loading.

For some applications, it is desirable to modify the propagation of the light beam using no mechanical motion. Such "beam steering" may be accomplished by slightly modifying the phase delay between lasing elements 56 in a linear fashion through the use of activated phasing elements, for example a liquid crystal spatial light modulator array.

Figure 2B:
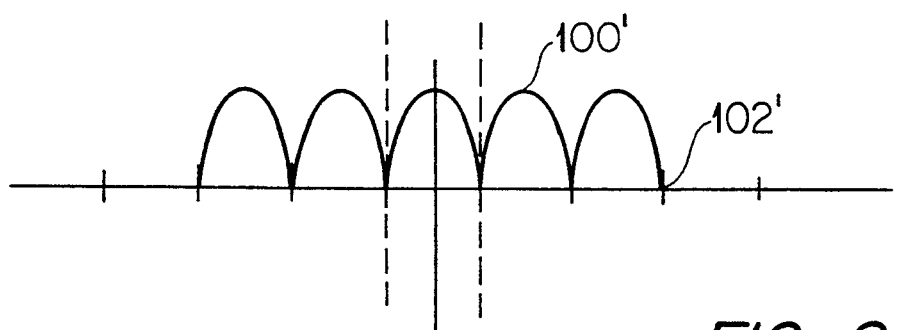
FIG. 2b is a sectional plot of light amplitude versus position of a phased array in which the relative phase difference between adjacent elements is 0 degrees.
Figure 2C:
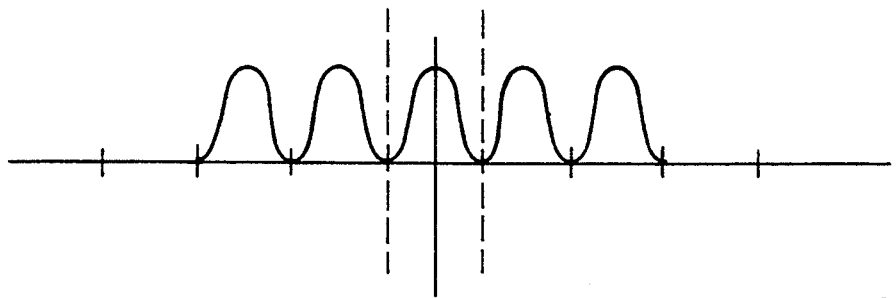
FIG. 2c is a sectional plot of light intensity (square of the amplitude) versus position of the phased array of FIG. 2b.

Referring now to FIGS. 2a, 2b and 2c, there are shown sectional plots along axis 44 or axis 46 of the light amplitude and intensity for a laser 10 having a periodic array of lasing elements 56. FIG. 2a shows a sectional plot of the light amplitude when adjacent light beam elements 66 are 180 degrees out of phase. The amplitude of the light beam elements has peaks, 100, corresponding to the positions of the centers of lasing elements 56, and zeros, 102, corresponding to the positions of separation means 58. The amplitude distribution of FIG. 2a is approximately a cosine function and has peaks and zeros represented by 100' and 102', respectively. FIG. 2b shows a sectional plot of the light amplitude when adjacent light beam elements 66 are 0 degrees out of phase. The amplitude distribution of FIG. 2b is approximately the absolute value of a cosine function. FIG. 2c shows a sectional plot of the light intensity for the case of either 180 degrees or 0 degrees phase difference between adjacent light beam elements 66. The intensity distribution of FIG. 2c is approximately the square of a cosine function. FIGS. 2b and 2c illustrate that even if the phase difference between adjacent light beam elements 66 is zero, there is still effectively an amplitude grating which will give rise to higher diffractive orders. In other words, the light amplitude emitted from laser 10 would be the same as in the case where a uniform amplitude plane wave is incident upon an amplitude grating having the distribution of FIG. 2b. By calculating the Fourier transform of the two-dimensional distribution of FIG. 2b and squaring the result, it is seen that less than 65% of the light propagates in the zeroth diffractive order 70. The invention described herein allows for much more than 65% of the light to propagate into a single diffractive order for a two-dimensional array. The distributions of FIGS. 2a, 2b, and 2c are idealizations of a real phased array laser. In the real case, the zeros 102 of the amplitude and intensity would have finite width, thereby further decreasing the fraction of light which propagates in the zeroth diffractive order 70.

Figure 3:
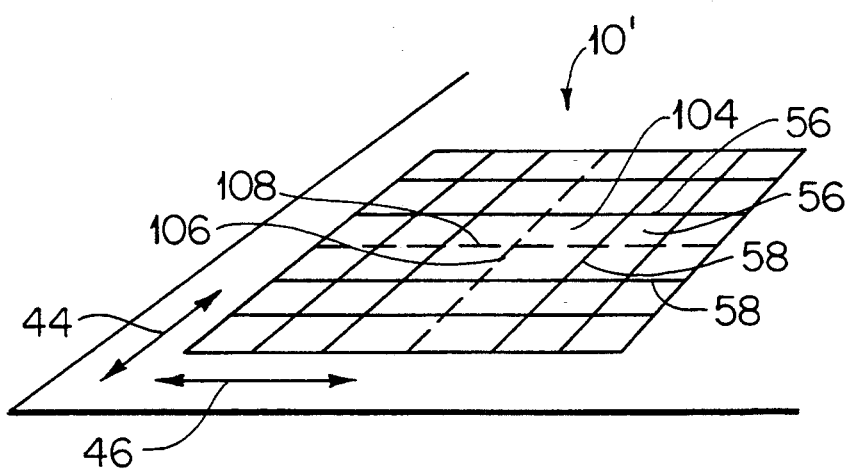
FIG. 3 is an isometric view of a vertical-cavity surface-emitting laser with lasing elements arranged in a rectangular array and having both linear dimensions of one element being twice as large as the linear dimensions of adjacent array elements.
Figure 4:
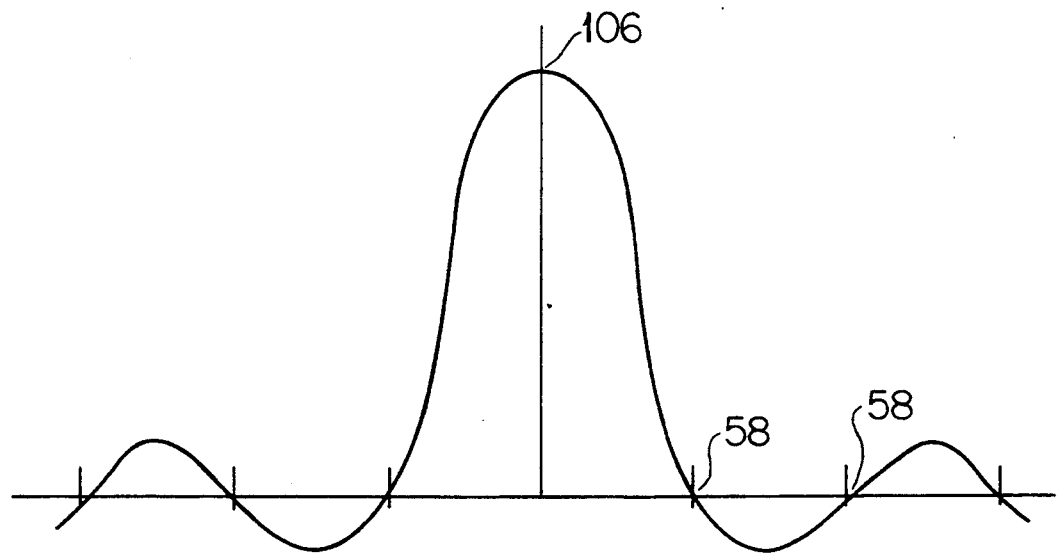
FIG. 4 is a sectional plot of light amplitude versus position of the laser of FIG. 3 in which a relative phase difference between adjacent elements is 180 degrees.

Referring now to FIG. 3, there is shown the top surface of a laser 10′ in which lasing elements 56 have unequal sizes and shapes. In one embodiment of the invention, central lasing region 104 is twice as wide in both transverse dimensions 44 and 46 as are adjacent lasing elements. The difference between the lasers of FIG. 1 and FIG. 3 is that the laser of FIG. 3 has removed separation means 106 and 108. This removal has the effect of increasing the amplitude of central lasing region 104 relative to other lasing regions and reversing the phase distribution on other side of removed separation means 106 and 108. A sectional plot, through removed separation means 106, of the amplitude distribution for laser 10′ of FIG. 3 is shown in FIG. 4. This amplitude distribution approximates a "sinc" function as defined in the book Linear systems, Fourier transforms, and optics, by Jack D. Gaskill, (J. Wiley & Sons 1978). The Fourier transform of a two-dimensional sinc function is a square; thus a large percentage of this output will be focused into a rectangular-shaped spot. In this case it is preferable for adjacent light beam elements to have a 180 degree phase difference, and a binary phase plate such as that described by Warren et al. is not desired. In cases such as this, the "additional optical means" 76 may be considered to be the removal or redistribution of the separation means 58. Due to the finite aperture of laser 10′, the focused spot intensity distribution will deviate from a perfect rectangular function, for example, the intensity will not be quite constant across the rectangle and there will be undesirable side ripples. It is thus advantageous to modify the structure of lasing elements 56 or separation means 58 in order to optimize the intensity distribution. Such modifications typically involve changing the spacing or width of separation means 58.

Figure 5:
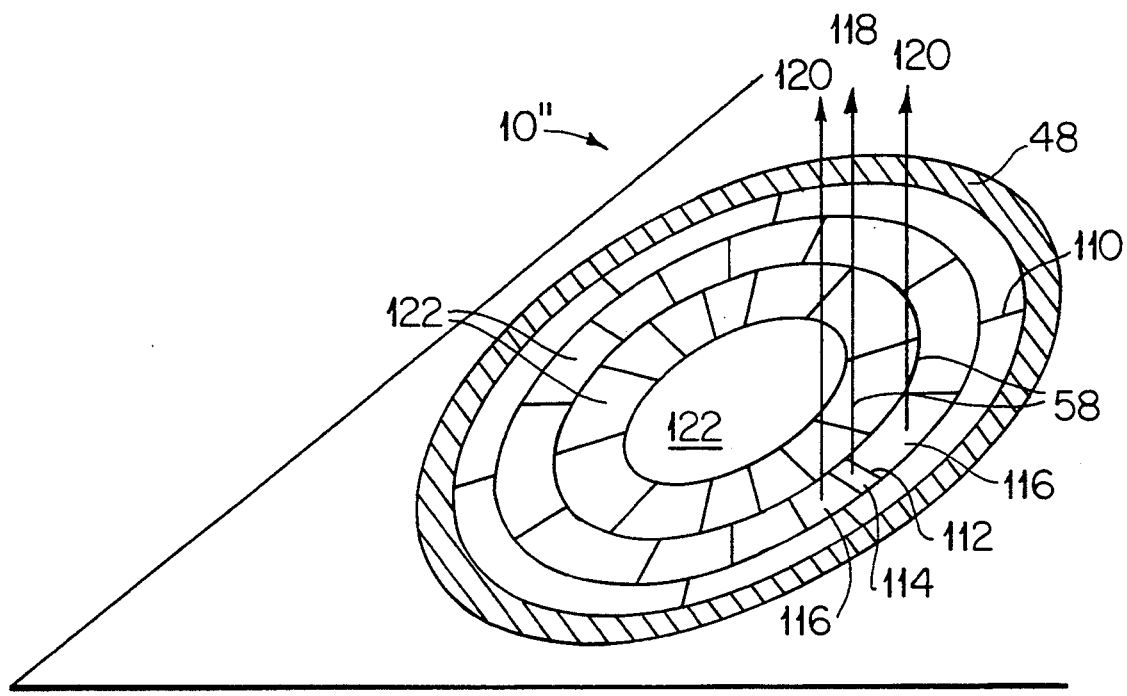
FIG. 5 is an isometric view of a vertical-cavity surface-emitting laser with lasing elements arranged in a concentric-patterned array.

Referring now to FIG. 5, there is shown the top surface of a laser 10″ in which separation means 58 have a concentric distribution. For the case where separation means 58 are electrically conductive, it is advantageous to furthermore include radial conductive elements 110 to facilitate electrical conduction from contact 48 to the separation means 58. It may be advantageous to group radial conductive elements into radial pairs 112. This pairing will create a lasing element 114 which is small in comparison to azimuthally adjacent lasing elements 116. Lasing element 114 will have a tendency to emit a light beam element 118 whose phase differs by 180 degrees from the light beam elements 120 emitted from azimuthally adjacent lasing elements 116; thus lasing elements 116 will emit light elements 120 which have the same phase. It is generally desirable in concentric configurations to have all azimuthally adjacent lasing elements to have the same phase. A desirable concentric configuration is such that adjacently radial zones 122 have equal areas as in a Fresnel zone plate. Alternatively, the zones 122 may be designed such that the integrated value of the light amplitude multiplied by the area is the same for all zones. The light amplitude distribution in this case will resemble the distribution shown in FIG. 4, however the relative amplitudes and spacings of the lasing regions will differ. For configurations approximating a Fresnel zone plate, the amplitude approximates a Bessel function whose Fourier transform is a cylinder function, also defined in the book by Gaskill. It is possible to further modify the spacings, thickness or shapes of the separation means 58 in order to optimize the intensity distribution of the focused spot to better approximate a cylinder function or any other desired intensity distribution.

Figure 6A:
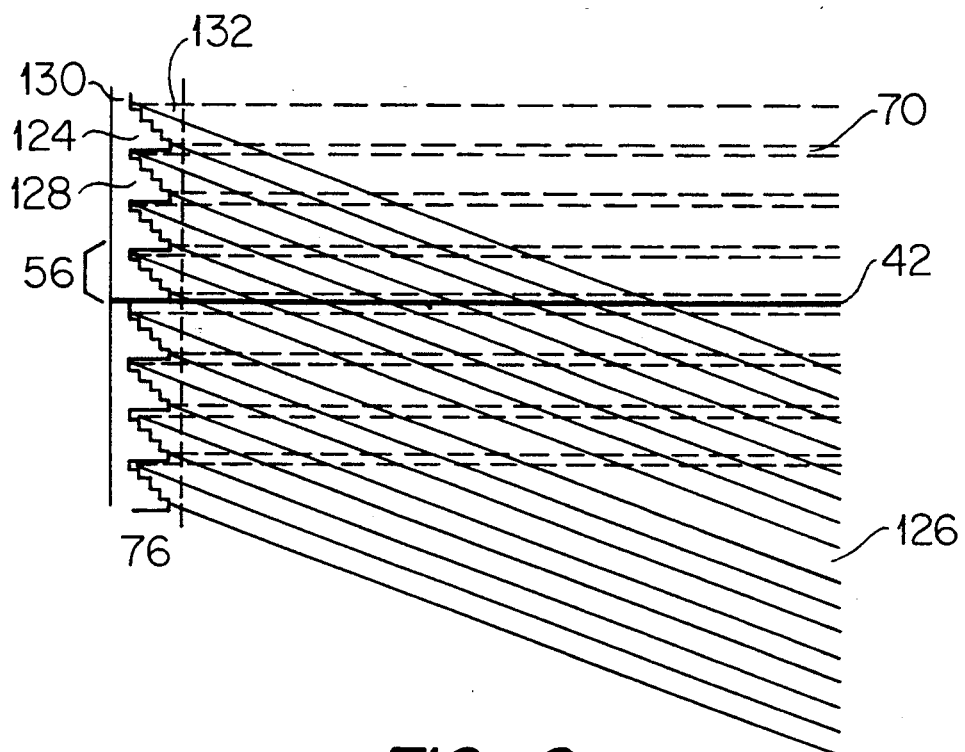
FIGS. 6a and 6b are side views of embodiments of a combination beam propagating into a first diffractive order.
Figure 6B:
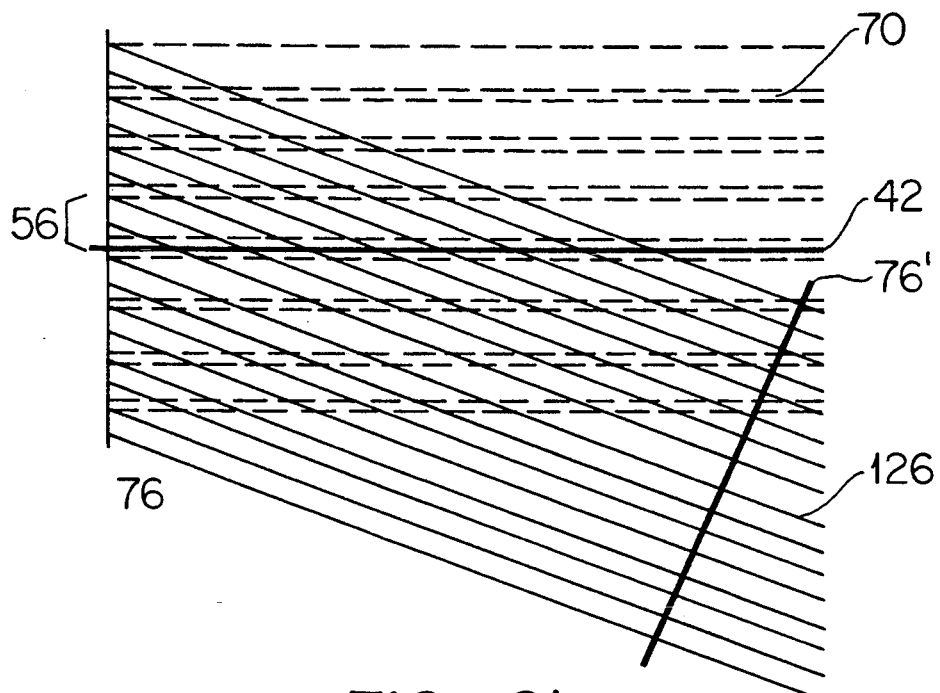

Referring now to FIGS. 6a and 6b, there are shown additional optical means 76 which enhance the fraction of light beam 68 which propagates into a first diffractive order 126. In FIG. 6a, additional optical means 76 comprises an array of identical refractive microprisms 124 which produce a nonuniform phase delay which varies across a light beam element 66. This configuration is especially appropriate for rectangularly configured lasing elements. Microprisms 124 may be used without a phase plate, in which case the maximum thickness 128 is located in a corner of rectangular lasing element 56, the minimum thickness 130 is located in the opposite corner of lasing element 56, and the first diffractive order 126 deviates from the cavity axis 42 in both transverse dimensions 44 and 46. Microprisms 124 may also be used in conjunction with a phase plate, in which case the maximum thickness 128 is located along an edge of lasing element 56, the minimum thickness 130 is located in the opposite edge of lasing element 56, and the first diffractive order 126 deviates from the cavity axis 42 in only one of the transverse dimensions 44 or 46. Importantly, microprisms 124 may be monolithically integrated into the structure of the lasers of FIGS. 1, 3 or 5. The structure and operation of microprisms 124 is similar to the structure and operation of a blazed diffraction grating. In some applications it may be advantageous to planarize additional optical means 76 by use of a planarizing layer 132. Typically, planarizing layer 132 will have a lower refractive index than that of microprisms 124. For example, microprisms 124 might comprise titanium dioxide having refractive index about 2.3, and planarizing layer 132 might comprise silicon dioxide having a refractive index about 1.4.

In FIG. 6b, additional optical means 76 comprises an external reflector 76′ which reflects at least part of the first diffractive order 126 back into lasing elements 56. In conjunction with lasing elements 56, reflector 76′ forms an external cavity in which the preferred mode for lasing is the first diffractive order 126. Reflector 76′ may be advantageously placed at one of the Talbot distances in order to maximize the coupling between lasing elements 56. Reflector 76′ may be used in combination with microprisms 124. Reflector 76′ may be monolithically integrated with the structure of the lasers of FIGS. 1, 3 or 5, and may take the form of a prism.

Figure 7A:
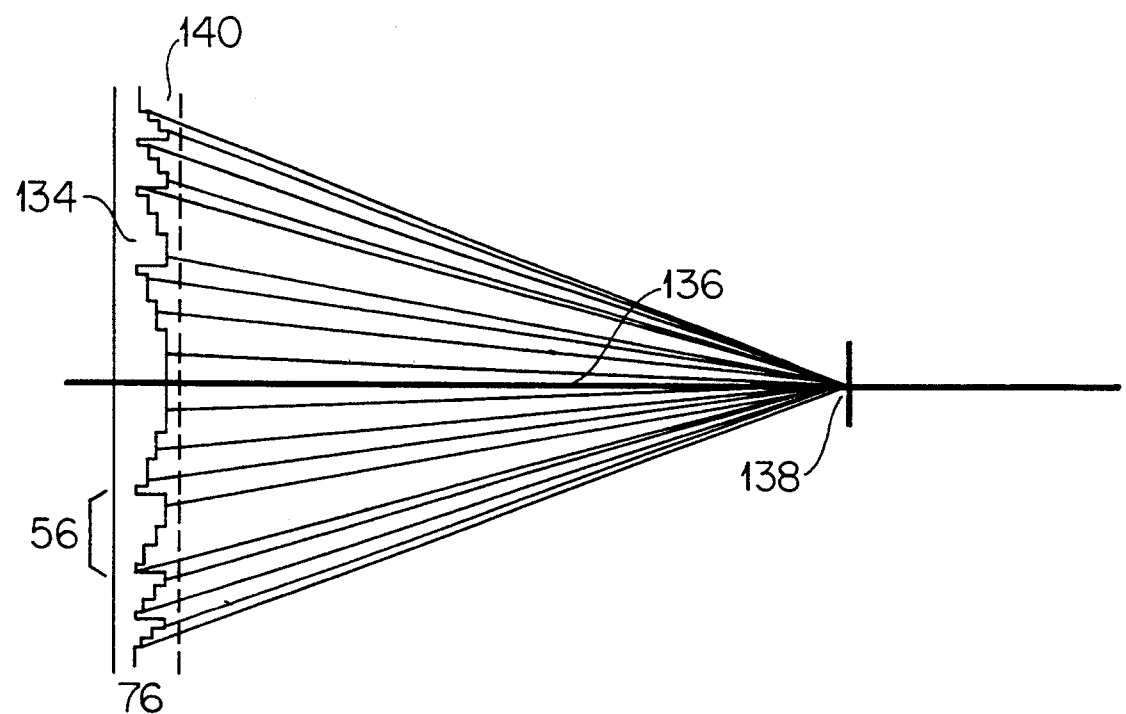
FIGS. 7a and 7b are side views of embodiments of a combination beam being focused to a single spot.
Figure 7B:
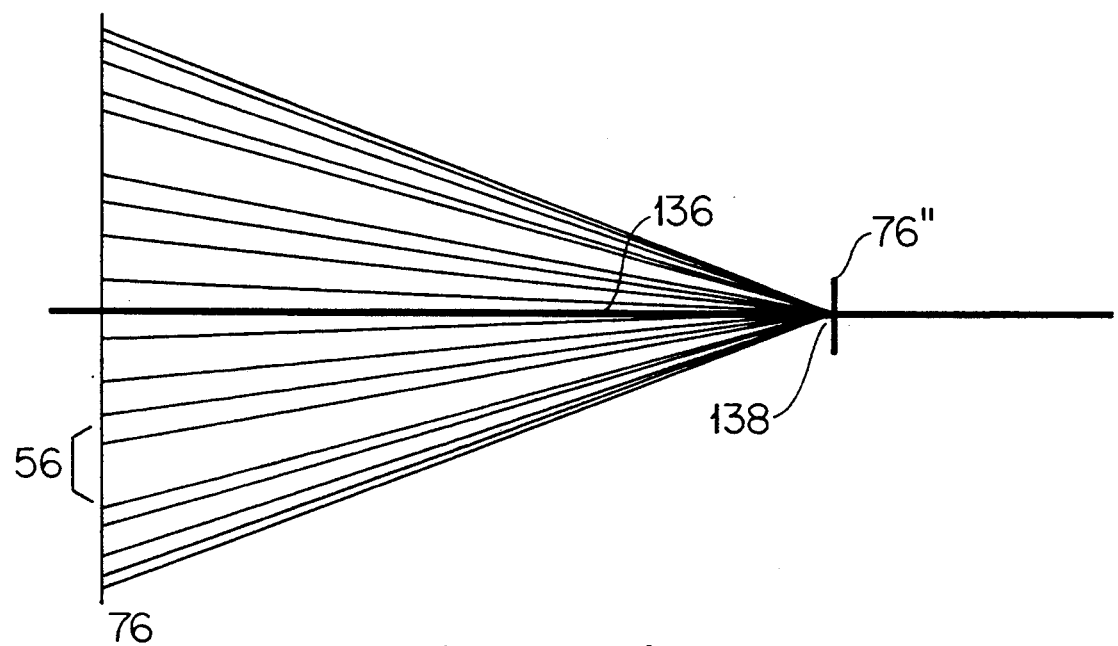

Referring now to FIGS. 7a and 7b, there are shown additional optical means 76 which enhance the fraction of light beam 68 which propagates into zeroth diffractive order 136, and focuses it to a spot 138. This configuration may be used for radial configurations, or with rectangularly configured lasing elements. In FIG. 7a, additional optical means 76 comprises an array of nonidentical refractive microprisms 134. A desirable configuration for microprisms 134 approximates a Fresnel lens. Microprisms 134 may be used in conjunction with the laser of FIG. 3, further aiding in the focusing of the light beam 68 to a single square spot. A concentric microprism configuration may be used with a rectangular array, most advantageously with the addition of a phase plate. In this case the concentric microprisms 134 would have a rectangular phase plate superimposed upon them. Note that the boundaries of the concentric zones and the rectangular lasing regions would be different, and that the boundary of the phase region defined by the concentric zones would cross through the lasing elements 56 and the phase plate regions. This structure, whether or not a phase plate is superimposed, may also have a planarizing layer 140. The structure of the microprisms 134 is typically similar to that of the microprisms 124, and the planarizing layer 140 is typically similar to planarizing layer 132. Importantly, microprisms 134 may be monolithically integrated into the structure of the lasers of FIGS. 1, 3 or 5.

In FIG. 7b, additional optical means 76 comprises an external reflector 76" which reflects at least part of the zeroth diffractive order 136 back into lasing elements 56. In conjunction with lasing elements 56, reflector 76" forms an external cavity in which the preferred mode for lasing is the zeroth diffractive order 136. Reflector 76" may be approximately flat and placed at or near focus 138, or it may be approximately spherical with its center of curvature at or near focus 138. Reflector 76" may be used in combination with microprisms 134. Reflector 76" may be monolithically integrated with the structure of the lasers of FIGS. 1, 3 or 5.

Figure 8A:
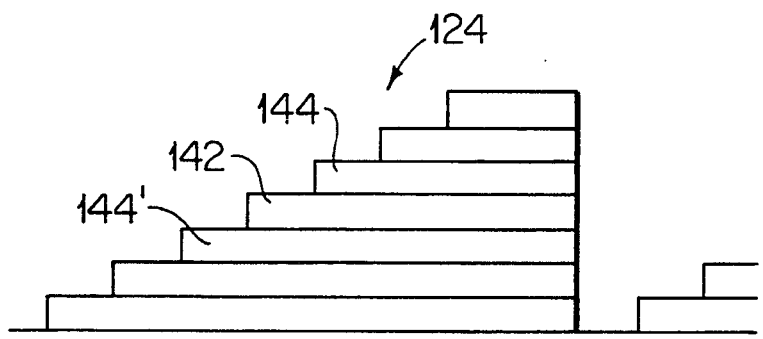
Figure 8B:
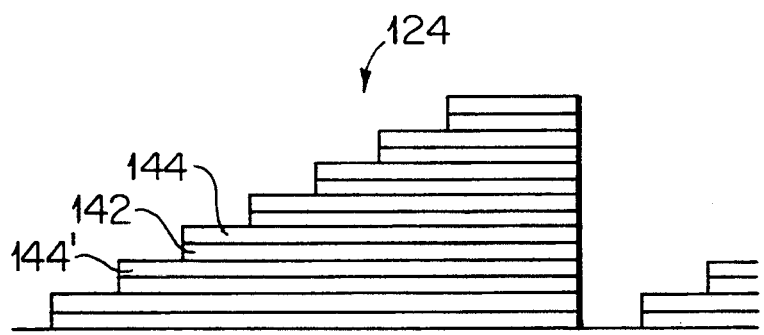

Referring now to FIGS. 8a and 8b, there are shown preferred embodiments to facilitate the fabrication of microprisms 124 or microprisms 134. Both embodiments comprise a stepwise approximation to an angled and/or curved surface which is well-suited for fabrication using semiconductor processing techniques. Both FIGS. 8a and 8b illustrate an eight-step structure which can be fabricated in three steps, each step comprising photolithography and etching to a precise depth. In FIG. 8a, microprism 124 comprises alternating layers 142 and 144, preferably having similar refractive indices, and having sufficiently different chemical properties such that either layer, for example layer 142, may be etched with an appropriate etchant which has a significantly reduced etch rate in the other layer, for example layer 144. It is furthermore desirable to have a second etchant which etches layer 144, but not layer 142. Use of the selective etches allows for precise depth control. It is sometimes advantageous to use alternating layers 142 and 144 in which there is only one selective etch available. In this case the embodiment illustrated in FIG. 8a is still possible, but the embodiment of FIG. 8b is preferred. In FIG. 8b, alternating layers 142 and 144 are both present in each step of the microprism 124. In this case, one may etch nonselectively through one layer 144 into layer 142, then use a selective etchant to etch the remainder of layer 142, stopping on the next layer 144'. It is also possible to use this process for the embodiment of FIG. 8a in cases where etching through an even number of layers is performed. Although both FIGS. 8a and 8b illustrate microprisms 124 of FIG. 6a, this entire discussion is equally valid for microprisms 134 of FIG. 7a. The layers 142 and 144 may be semiconductors or dielectrics, or a combination of both. Exemplary alternating layers are GaAs with AlGaAs, SiO with $Si_3N_4$, and $Si_3N_4$ with $SiO_2$.

Figure 9:
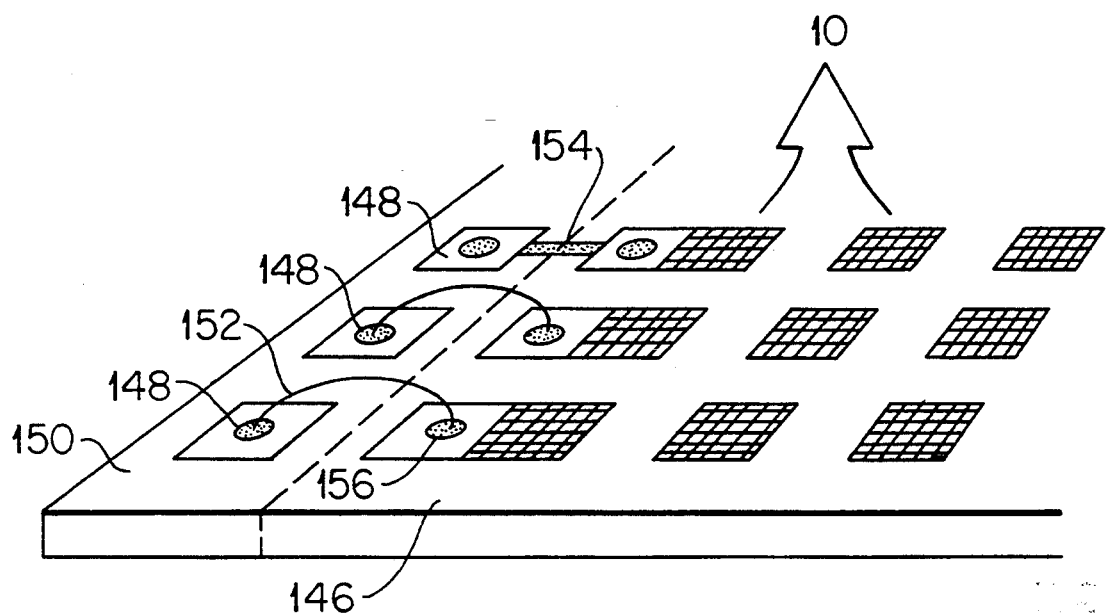
FIG. 9 is an isometric view of an array, of phased-array VCSELs, which are driven by a multiplicity of electronic driver elements.

Referring now to FIG. 9, there is shown an array of lasers 10 fabricated on semiconductor laser chip 146. Each laser 10 is electrically addressed. The electrical signals are generated in laser drivers 148 fabricated on electrical chip 150 and communicated to lasers 10 through wire bonds 152. In some cases, the electrical chip 150 and laser chip 146 might be the same chip, in which case the electrical signals would be communicated through patterned electrical lead 154. In either case, the electrical signals arrive at contact pads 156 which are electrically contacted to lasers 10. Each laser 10 may incorporate any or all of the inventive features described herein.

It is to be appreciated and understood that the specific embodiments of the invention are merely illustrative of the general principles of the invention. Various modifications may be made upon the preferred embodiments described consistent with the principles set forth. For example, the laser structure and electrical injection schemes may take on a variety of forms, differing substantially from the structure illustrated in FIG. 1 and still utilize the invention. Both electrical contacts may be on the top side of the substrate; contact layer 36 and contact 40 may lie between cladding layer 28 and mirror 30; etching processes could replace part or all of the implantations shown. This invention focuses on the patterning of the lasing elements and on the use of physical optical elements integrated to the laser structure. The microprisms are illustrated with finite steps in their phase delays. This is illustrative of a preferred method of fabrication, namely a multi-step patterning and etching which is particularly well-suited for wafer scale manufacturing. The microprisms could however have smooth slopes and be fabricated by, for example, molding, or the microprisms could be of a gradient index form. Although the term "microprisms" suggest flat surfaces, or approximations thereof, the microprisms of FIGS. 6a and 7a may also approximate curved surfaces. The Fresnel lens embodiment shown in FIG. 7a may undergo modifications to compensate for other beam deficiencies; alternatively it may take the form of a real refractive lens, either spherical or aspherical, or a gradient index lens. Although the discussion is in the context of two-dimensional arrays of VCSELs, the techniques are also valid for one-dimensional arrays of VCSELs, one-dimensional arrays of edge-emitting semiconductor lasers, one- or two-dimensional arrays of grating surface-emitting lasers, and one- or two-dimensional arrays of horizontal-cavity semiconductor lasers with mirrors etched to reflect the light beam elements out from the semiconductor substrate.

While the invention has been described in connection with one of its preferred embodiments, it should be understood that changes and modifications may be made without departing from the scope of the appended claims.

What is claimed is:

1. A semiconductor laser comprising:
   an optical cavity having a first and second dimension, both perpendicular to said optical cavity;
   first and second mirrors, said mirrors defining said optical cavity;
   an active layer for providing optical gain;
   at least two separate lasing elements, said at least two lasing elements having different first dimensions or different second dimensions and separated by separation means, said separation means being patterned in substantially rectangular patterns, each of said lasing elements having an effective optical cavity length;
   means for emitting light beam elements from said lasing regions, said light beam elements characterized by amplitude and phase; and
   means for substantially phase-locking said light beam elements and thereby causing said light beam elements to collectively for a light beam.

2. The laser recited in claim 1 in which at least one rectangular pattern is approximately twice as wide as an adjacent rectangular pattern.

3. The laser recited in claim 1 in which said light beam is focused into a spot whose intensity distribution approximates a rectangular function.

4. The laser recited in claim 1 in which said laser is a vertical cavity surface emitting laser and said optical cavity has been expanded.

5. The laser recited in claim 1 in which said laser is a vertical cavity surface emitting laser and at least one dimension of an aperture of at least one lasing element is at least 10 times larger than a vacuum wavelength of a laser emission from said laser.

6. The laser recited in claim 1 in which said lasing elements comprise a two-dimensional array.

7. The laser recited in claim 1 which comprises a plurality of said lasers.

8. The laser recited in claim 7 in which each of said lasers are individually addressable.

9. The laser recited in claim 1 wherein said lasing element is a one dimensional array.

10. A semiconductor laser comprising:
an optical cavity having a first and second dimension, both perpendicular to said optical cavity;
first and second mirrors, said mirrors defining said optical cavity;
an active layer for providing optical gain;
at least two separate lasing elements, each of said lasing elements having an effective optical cavity length, said lasing elements separated by at least a first and second separation means, said separation means being patterned in substantially elliptical patterns, and said first separation means further comprising at least one segment in a substantially radial orientation which joins said first separation means to said second separation means;
means for emitting light beam elements from said lasing regions, said light beam elements characterized by amplitude and phase; and
means for substantially phase-locking said light beam elements and thereby causing said light beam elements to collectively for a light beam.

11. The laser recited in claim 10 in which at least one of said separation means are patterned substantially in concentric circular patterns.

12. The laser recited in claim 10 in which said segments are paired and closely spaced such that substantially the same phase is emitted on either side of said segment pair.

13. The laser recited in claim 10 in which said light beam is focused into a spot whose intensity distribution approximates an elliptical cylinder function.

14. The laser recited in claim 10 in which said light beam is focussed into a spot whose intensity distribution approximates a circular cylinder function.

15. The laser recited in claim 10 in which at least one of said separation means comprise a patterned metallic coating.

16. The laser recited in claim 15, in which said patterned metallic coating serves as an electrode.

17. The laser recited in claim 10, further comprising first and second electrodes for allowing electrical injection of said laser.

18. The laser recited in claim 10 in which a metallic coating modifies the reflectivity of at least one of said mirrors.

19. The laser recited in claim 18 in which said separation means comprises pattern totally absent of a metallic coating.

20. The laser recited in claim 18 wherein at least one of said separation means comprises a pattern substantially absent of said metallic coating.

21. The laser recited in claim 10 in which at least one of said separation means comprises a partial absence of at least one of said mirrors.

22. The laser recited in claim 10 in which at least one of said separation means comprises a total absence of at least one of said mirrors.

23. The laser recited in claim 10 in which at least one of said separation means comprises means for partially disabling gain from said active layer.

24. The laser recited in claim 10 wherein said laser is a vertical cavity surface emitting laser and at least one dimension of an aperture of at least one lasing element is at least 10 times larger than a vacuum wavelength of a laser emission from said laser.

25. The laser recited in claim 10 wherein said a plurality of said lasers are provided.

26. A semiconductor laser comprising:
an optical cavity having a first and second dimension, both perpendicular to the optical cavity;
first and second mirrors, said mirrors defining said optical cavity;
an active layer for providing optical gain;
at least two separate lasing elements, each having an effective optical cavity length and separated by separation means, said separation means being patterned substantially in concentric circumjacent patterns;
means for emitting light beam elements from said lasing regions, said light beam elements characterized by amplitude and phase; and
means for substantially phase-locking said light beam elements and thereby causing said light beam elements to collectively for a light beam, and a fraction of said light beam which propagates into a single diffractive order; and
optical means for increasing said fraction.

27. The laser recited in claim 26 in which at least one concentric circumjacent pattern is approximately twice as wide as an adjacent concentric circumjacent pattern.

28. The laser recited in claim 26 in which said light beam is focused into a spot whose intensity distribution approximates a rectangular function.

29. The laser recited in claim 26 in which said separation means further comprises at least one segment in a substantially radial orientation which joins two of said separation means.

30. The laser recited in claim 29 in which said segments are paired and closely spaced such that substantially the same phase is emitted on either side of said segment pair.

31. The laser recited in claim 26 in which said light beam is focused into a spot whose intensity distribution approximates an elliptical cylinder function.

32. The laser recited in claim 26 in which said light beam is focussed into a spot whose intensity distribution approximates a circular cylinder function.

33. The laser recited in claim 26 in which said separation means comprise a patterned metallic coating.

34. The laser recited in claim 33 in which said patterned metallic coating serves as an electrode.

35. The laser recited in claim 26 further comprising first and second electrodes for allowing electrical injection of said laser.

36. The laser recited in claim 26 in which a metallic coating modifies the reflectivity of at least one of said mirrors.

37. The laser recited in claim 36 in which said separation means comprises a pattern totally absent of a metallic coating.

38. The laser recited in claim 26 in which said separation means comprises a partial absence of at least one of said mirrors.

39. The laser recited in claim 26 in which said separation means comprises a total absence of at least one of said mirrors.

40. The laser recited in claim 26 in which said separation means comprises means for partially disabling gain from said active layer.

41. The laser recited in claim 26 in which said laser is a vertical cavity surface emitting laser and said optical cavity has been expanded.

42. The laser recited in claim 26 in which said laser is a vertical cavity surface emitting laser and at least one dimension of an aperture of at least one lasing element is at least 4 times larger than a vacuum wavelength of a laser emission from said laser.

43. The laser recited in claim 26 in which said lasing elements comprise a two-dimensional array.

44. The laser recited in claim 26 in which said fraction is greater than 65%.

45. The laser recited in claim 26 which comprises a plurality of said lasers.

46. The laser recited in claim 45 in which each of said lasers are individually addressable.

* * * * *

UNITED STATES PATENT AND TRADEMARK OFFICE
CERTIFICATE OF CORRECTION

PATENT NO. : 5,446,754

DATED : August 29, 1995

INVENTOR(S) : Jewell, et al.

It is certified that error appears in the above-identified patent and that said Letters Patent is hereby corrected as shown below:

Title page, item [57], col. 2,
In the Abstract, line 7, replace "form" with -- from --.
Column 7, line 15, replace "other" with -- either --.
Column 7, line 51, replace "dement" with -- element --.
Column 7, line 56, after "lasing elements" delete -- to --.
Column 8, line 16, replace "dement" with -- element --.
Column 8, line 18, replace "dement" with -- element --.
Column 8, line 40, replace "reflectior" with -- reflector --.
Column 10, line 68, replace "for" with -- form --.
Column 11, line 44, replace "for" with -- form --.
Column 11, line 56, replace "focussed" with -- focused --.
Column 12, line 40, replace "for" with -- form --.
Column 12, line 63, replace "focussed" with -- focused --.

Signed and Sealed this

Seventh Day of May, 1996

Attest:

BRUCE LEHMAN

Attesting Officer

Commissioner of Patents and Trademarks